United States Patent
Yatsuzuka

Patent Number: 5,596,758
Date of Patent: Jan. 21, 1997

[54] MEMORY PROTECTING DEVICE FOR USE IN COMPACT ELECTRONIC APPARATUS EQUIPPED WITH AN EXTERNAL POWER SUPPLY

[75] Inventor: Yasufumi Yatsuzuka, Kashihara, Japan

[73] Assignee: Sharp Kabushiki Kaisha, Osaka, Japan

[21] Appl. No.: 405,371

[22] Filed: Mar. 15, 1995

Related U.S. Application Data

[63] Continuation of Ser. No. 887,754, May 27, 1992, abandoned.

[30] Foreign Application Priority Data

May 30, 1991 [JP] Japan ................. 3-127692

[51] Int. Cl.$^6$ ................. G06F 15/20; G06F 12/16
[52] U.S. Cl. ................. 395/750; 365/226; 365/227; 365/228
[58] Field of Search ................. 395/750; 371/66; 365/226, 227, 228

[56] References Cited

U.S. PATENT DOCUMENTS

| | | | |
|---|---|---|---|
| 3,870,901 | 3/1975 | Smith et al. | 365/228 |
| 4,590,553 | 5/1986 | Noda | 364/200 |
| 4,631,418 | 12/1986 | Toyomura | 395/750 |
| 4,646,132 | 2/1987 | Kuwabara et al. | 365/226 |
| 4,675,538 | 6/1987 | Epstein | 371/66 |
| 4,922,176 | 5/1990 | Kim | 318/602 |
| 5,027,328 | 6/1991 | Nakashima | 365/226 |
| 5,058,075 | 10/1991 | Mizuta | 365/229 |
| 5,101,119 | 3/1992 | Yoshimori et al. | 365/228 |
| 5,212,664 | 5/1993 | Shinohara | 365/229 |
| 5,243,577 | 9/1993 | Ueda et al. | 365/228 |
| 5,307,318 | 4/1994 | Nemoto | 365/226 |
| 5,430,681 | 7/1995 | Sugawara et al. | 365/227 |

FOREIGN PATENT DOCUMENTS

| | | |
|---|---|---|
| 2-27414 | 1/1990 | Japan . |
| 2-59958 | 2/1990 | Japan . |
| 2-144710 | 6/1990 | Japan . |

Primary Examiner—George B. Davis
Attorney, Agent, or Firm—Nixon & Vanderhye P.C.

[57] ABSTRACT

A main power supply is connected to a memory through a diode which is provided in such a manner as to allow the current to flow from the main power supply to the memory. An external power supply terminal is connected to a cathode terminal of the diode. The voltage supervising circuit supervises the level of the voltage of the main power supply by detecting the level of the voltage at the anode terminal of the diode. When the level of the voltage is below a specified level, a CPU retracts a date which is being processed to an external memory in accordance with a signal from the voltage supervising circuit.

3 Claims, 2 Drawing Sheets

MEMORY PROTECTING DEVICE FOR USE IN COMPACT ELECTRONIC APPARATUS EQUIPPED WITH AN EXTERNAL POWER SUPPLY

This application is a continuation of application Ser. No. 07/887,754, filed May 27, 1992, now abandoned.

BACKGROUND OF THE INVENTION

1. Field of the Invention

The present invention relates to a memory protecting device which protects memory data from being lost or broken due to a reduction in a supply voltage in a compact electronic apparatus which is operated both by a built-in main power supply and an external power supply.

2. Description of the Prior Art

FIG. 3 is a block diagram of a conventional memory protecting device for use in a compact electronic apparatus equipped with an external power supply. A main block 10 includes elements which need not be backed up by a battery, such as a CPU and a ROM. A memory 20 is backed up by a backup power supply 40. An external power supply terminal 50, to which an external power supply is to be connected, is connected to a main power supply 60 at a node 70. The voltage of the external power supply terminal 50 is fed to the memory 20 and a voltage supervising circuit 30 through a diode D10. The backup power supply 40 is connected to the memory 20 and the voltage supervising circuit 30 through a diode D20. The voltage supervising circuit 30 supervises the level of voltage at the node 70, at which the main power supply 60 and the external power supply terminal 50 are connected to each other (namely, the voltage at a node 80) and the level of voltage of the backup power supply 40 (namely, the voltage at a node 90).

A conventional memory protecting device having the above-mentioned circuit construction is operated in the following way. The level of the voltage at node 90 is checked by the voltage supervising circuit 30. In the case when the level of the voltage at node 90 is detected to be below a specified level, the CPU in the main block 10 retracts the data which is being processed on the memory 20 and closes the memory 20. The memory 20 is backed up by the backup power supply 40. In the case when the level of the voltage at the node 90 is detected not to be below the specified level, the level of the voltage at the node 80 is checked. In the case when the level of the voltage at the node 80 is detected to be below a specified level, the CPU closes the memory 20 in the above-mentioned procedure. The voltage supervising circuit 30 continuously supervises the levels of the voltages at the nodes 90 and 80 in this way. When the level of either voltage is below the specified level, the memory 20 is closed in order to protect a memory data in the memory 20 from being lost or broken.

Generally, this type of memory protecting device is constructed so that an external power supply connecter which is connected to the external power supply terminal 50 cannot be easily disconnected. It sometimes occurs, however, that the connector becomes disconnected from the external power supply terminal 50 when, for example, the electronic apparatus is dropped or a shock is applied. If the main power supply 60 does not have a voltage at a sufficiently high level in such a case, the power supply to the CPU is cut off the instant the connector is disconnected, thereby undesirably preventing the memory 20 from being closed.

SUMMARY OF THE INVENTION

The memory protecting device for use in a compact electronic apparatus equipped with an external power supply of this invention includes a memory; a main power supply for supplying a main voltage to the memory; a backup power supply for supplying a backup voltage to the memory; an external power supply terminal for supplying an external voltage to the memory; a diode provided between the main power supply and the external power supply terminal, the diode including an anode terminal connected to the main power supply and a cathode terminal connected to the external power supply terminal; a voltage supervising section for detecting the level of the main voltage at a node between the main power supply and the diode; and a control section for retracting data which is being processed to an external memory and closing the memory in accordance with a signal form the voltage supervising section when the level of the main voltage is detected to be below a specified level, regardless of the level of the external voltage.

In one embodiment of the invention, the voltage supervising section detects the level of the backup voltage, and the control section retracts data which is being processed to the external memory and closes the memory in accordance with a signal form the voltage supervising section when the level of the backup voltage is detected to be below a specified level, regardless of the level of the main voltage and the level of the external voltage.

Thus, the invention descried herein makes possible the objective of providing a memory protecting device, for use in a compact electronic apparatus equipped with an external power supply, which closes a memory even if the level of the supply voltage is reduced by, for example, a sudden disconnection of an external power supply connector.

BRIEF DESCRIPTION OF THE DRAWINGS

This invention may be better understood and its numerous objects and advantages will become apparent to those skilled in art by reference to the accompanying drawings as follows.

DETAILED DESCRIPTION OF A PREFERRED EMBODIMENT

The present invention will be described by way of an illustrating example with reference to the accompanying drawings.

Figure 1:
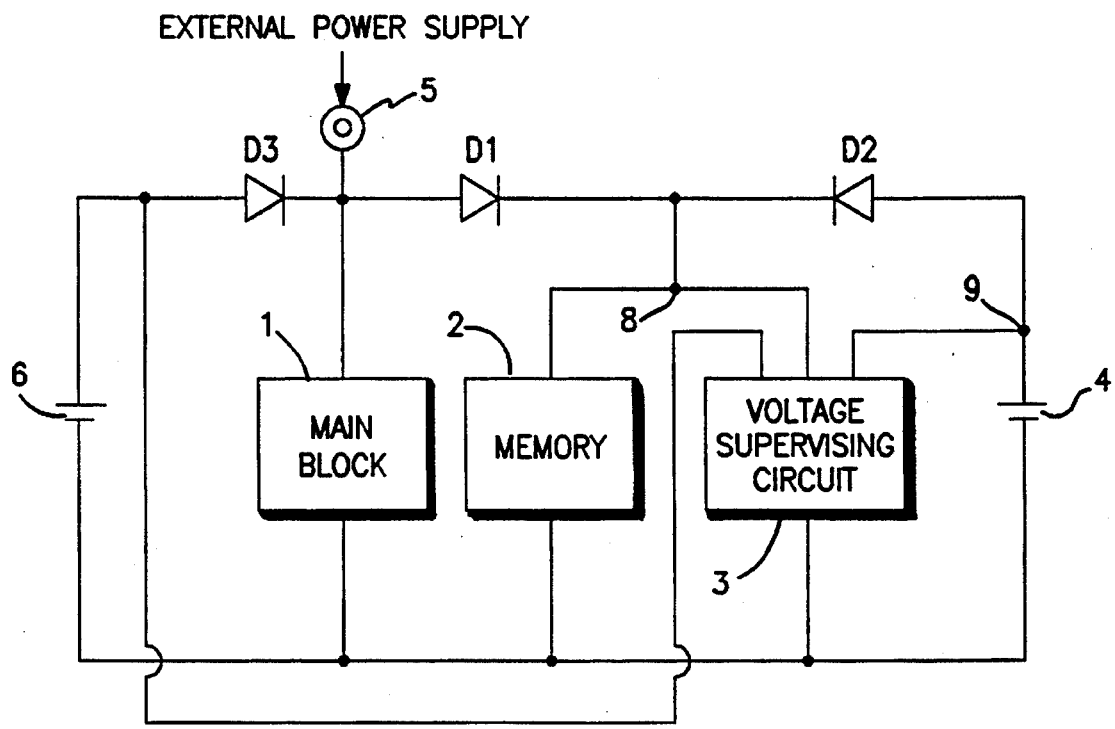
FIG. 1 is a block diagram of a memory protecting device according to the present invention.

FIG. 1 shows a construction of a memory protecting device according to the present invention.

The memory protecting device includes a main block 1, a memory 2, a built-in main power supply 6 for supplying a voltage to the memory 2 and the like, a backup power supply 4 for supplying a backup voltage to the memory 2, and an external power supply terminal 5 for supplying an external voltage to the memory 2. A diode D2 is provided between the memory 2 and the backup power supply 4 in such a manner as to allow the current to flow from the backup power supply 4 to the memory 2 (namely, in a forward direction). A diode D1 is provided between the memory 2 and the main power supply 6 in such a manner as to allow the current to flow from the main power supply 6 to the memory 2 (namely, in a forward direction). Each of the main power supply 6 and the backup power supply 4 is a battery. The main block 1 includes a CPU, a ROM and the like which need not be backed up by a battery.

The memory protecting device also includes a diode D3 provided between the main power supply 6 and the external power supply terminal 5. The diode D3 has a anode terminal connected to the main power supply 6 and a cathode terminal connected to the external power supply terminal 5. The diode D3 is provided in such a manner as to allow the current to flow from the main power supply 6 to the memory 2 (namely, in a forward direction).

The memory protecting device further includes a voltage supervising circuit 3 for detecting the level of voltage between the main power supply 6 and the diode D3 (namely, the voltage at a node 8) and also for detecting the level of the backup voltage (namely, the voltage at a node 9). In the case when the level of the voltage at the node 8 is detected to be below a specified level, the CPU in the main block 1 retracts data which is being processed to an external memory (not shown) and closes the memory 2 in accordance with a signal from the voltage supervising circuit 3, regardless of the level of the external voltage. In the case when the level of the voltage at node 9 is detected to be below a specified level, the CPU in the main block 1 retracts data which is being processed to the external memory and closes the memory 2 in accordance with a signal from the voltage supervising circuit 3, regardless of the level of the voltage at the node 8 and the level of the external voltage.

Figure 3:
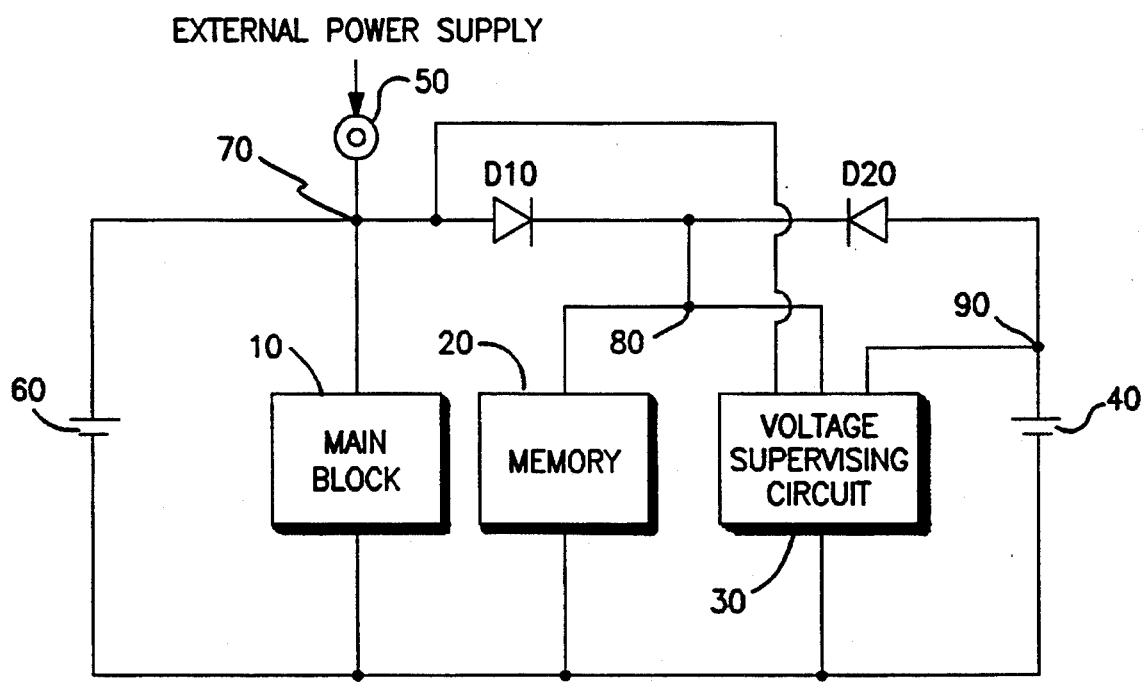
FIG. 3 is a block diagram of a conventional memory protecting device.

The memory protecting device according to the above example is distinct from the conventional memory protecting device shown in FIG. 3 in that the diode D3 is provided between the main power supply 6 and the external power supply terminal 5 and that the level of the voltage at the anode terminal of the diode D3 is directly supervised by the voltage supervising circuit 3. The memory 2 is connected to the main power supply 6 through the diode D3 which is provided in a forward direction, and the external power supply terminal 5 is connected to the cathode terminal of the diode D3. The anode terminal of the diode D3 is connected to the voltage supervising circuit 3.

Figure 2:
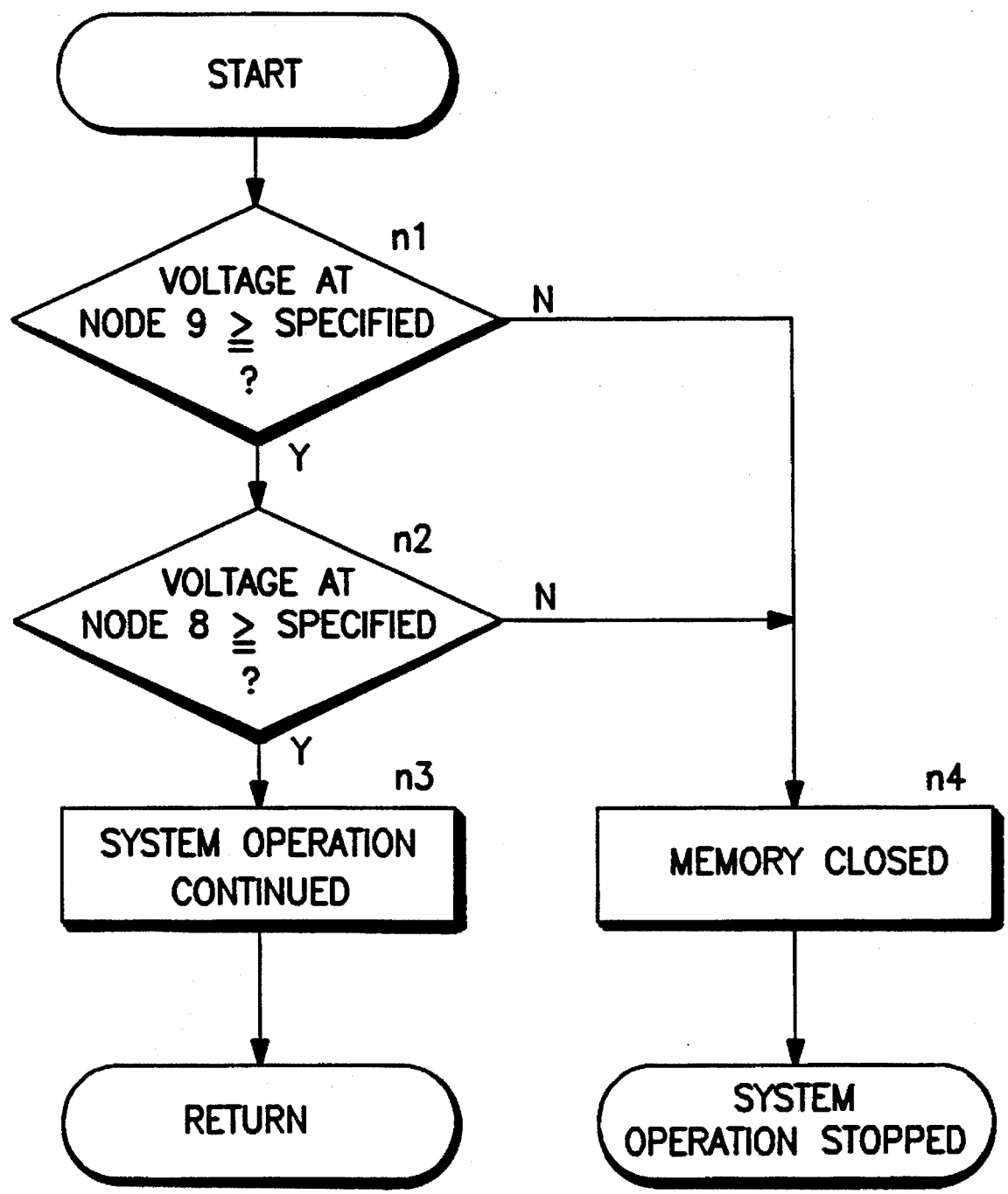
FIG. 2 is a flowchart of an operation of the memory protecting device according to the present invention.

A voltage supervising operation of the memory protecting device according to the present invention will be described with reference to FIG. 2.

First, whether the level of the voltage at node 9 is at a specified level at the lowest is judged (n1). If no, the memory 2 is closed (n4). If yes, whether the level of the voltage at node 8 is at a specified level at the lowest is judged (n2). If no, the memory 2 is closed (n4). If yes, a system of the compact electronic apparatus continues operating (n3). Practically, the voltage supervising circuit 3 continuously checks the levels of the voltages at the nodes 8 and 9. If any abnormality is found in which case the level of either voltage is detected to be below the specified level, an interrupt is instructed to the CPU in the main block 1. When the CPU detects that the interrupt is instructed due to a reduction in the supply voltage, the CPU immediately retracts the data which is being processed to the external memory, closes the memory 2, and stops the operation of the system.

In the above construction, the diode D3 is provided in the forward direction, and the level of the voltage at the anode terminal of the diode D3, namely, the level of the voltage of the main power supply 6 is directly supervised by the voltage supervising circuit 3. Accordingly, any lack of a sufficient level of voltage at node 8 is detected by the voltage supervising circuit 3 even in the state where the external power supply terminal 5 is connected. Therefore, the electronic apparatus does not operate unless the voltage at the node 8 is in a normal state, namely, is at a sufficiently high level. In other words, the memory 2 is closed when the level of the voltage at node 8 (the voltage between the voltage 6 and the diode D3) is reduced to a level below the specified one, regardless of the level of the external voltage. This means that, even if the external power supply connector is disconnected by accident, the memory data is not lost or broken. As a result, a more reliable memory protecting device and further, a more reliable electronic apparatus can be realized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A memory protecting device, comprising:

memory means;

a main power supply for supplying a main voltage to the memory means;

a backup power supply for supplying a backup voltage to the memory means;

an external power supply terminal for supplying an external voltage to the memory means;

first diode means connected between the memory means and the external power supply terminal, the first diode means including an anode terminal connected to the external power supply terminal and a cathode terminal connected to the memory means;

second diode means connected between the memory means and the backup power supply, the seconddiode means including an anode terminal connected to the main power supply and a cathode terminal connected to the memory means;

third diode means connected between the main power supply and the external power supply terminal, the third diode means including an anode terminal connected to have a same potential as the main power supply and a cathode terminal connected to the external power supply terminal;

voltage supervising means for detecting the level of the main voltage at a node between the anode terminal of the main power supply and the third diode means; and control means for closing the memory means in accordance with a signal from the voltage supervising means when the level of the main voltage is detected to be below a specified level.

2. A memory protecting device according to claim 1, wherein the voltage supervising means detects the level of the backup voltage, and the control means closes the memory means in accordance with a signal from the voltage supervising means when the level of the backup voltage is detected to be below a specified level.

3. A memory protecting device according to claim 1, wherein each of the main power supply and the backup power supply is a battery.

\* \* \* \* \*